United States Patent
Nojo et al.

(10) Patent No.: US 6,303,506 B1
(45) Date of Patent: Oct. 16, 2001

(54) COMPOSITIONS FOR AND METHOD OF REDUCING/ELIMINATING SCRATCHES AND DEFECTS IN SILICON DIOXIDE DURING CMP PROCESS

(75) Inventors: Haruki Nojo, Wappingers Falls; Ronald J. Schutz, Millbrook; Ravikumar Ramachandran, Ossining, all of NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/409,464

(22) Filed: Sep. 30, 1999

(51) Int. Cl.$^7$ .................................................. H01L 21/00
(52) U.S. Cl. .............................. 438/692; 216/38; 216/88; 216/99; 252/79.5; 438/756
(58) Field of Search .................. 252/79.1, 79.5; 438/692, 745, 756; 216/38, 88, 99

(56) References Cited

U.S. PATENT DOCUMENTS

| | | | |
|---|---|---|---|
| 3,426,077 | * | 2/1969 | Eiseman et al. ............ 252/79.5 X |
| 4,339,340 | * | 7/1982 | Muraoka et al. ............ 252/79.5 |
| 4,588,474 | | 5/1986 | Gross ...................... 156/659.1 |
| 5,567,300 | | 10/1996 | Datta et al. ................ 205/652 |
| 5,607,718 | | 3/1997 | Sasaki et al. ............... 427/97 |
| 5,769,689 | | 6/1998 | Cossaboon et al. ........... 451/41 |
| 6,068,788 | * | 5/2000 | Kezuka et al. ............. 438/745 X |

* cited by examiner

Primary Examiner—William A. Powell
(74) Attorney, Agent, or Firm—Stanton C. Braden

(57) ABSTRACT

An aqueous slurry-less composition for chemical-mechanical-polishing of a silicon dioxide workpiece comprising: a cationic surfactant that is soluble and ionized at neutral to alkaline pH conditions, in which the cationic surfactant is present in an aqueous slurry-less composition in an amount less than its critical micelle concentration.

17 Claims, 1 Drawing Sheet

COMPOSITIONS FOR AND METHOD OF REDUCING/ELIMINATING SCRATCHES AND DEFECTS IN SILICON DIOXIDE DURING CMP PROCESS

BACKGROUND OF THE INVENTION

1. Field of the Invention

The invention relates to the use of cationic surfactants in slurry-less environments during chemical mechanical polishing (CMP) of silicon dioxide wafer surfaces to substantially eliminate or reduce scratches and defects produced during the CMP process.

Certain categories of cationic surfactants chemisorb onto the silicon dioxide portion of the wafer during VLSI processing under all pH conditions, namely, acidic, neutral and basic pHs.

2. Description of the Prior Art

In recent years new chemical mechanical polishing (CMP) techniques have come into use that use a slurry-less polishing scheme for silicon wafer surfaces where the polishing pad has abrasive particles embedded therein. In particular, the polishing pad contains $CeO_2$ as the abrasive material for silicon dioxide CMP applications.

During the CMP process, the wafer to be polished is abraded against the pad surface in an aqueous environment. However, during the CMP process at neutral or alkaline conditions these polishing pads produce defects and scratches, thereby causing yield losses.

Accordingly, it is desirable to devise compositions for and methods of, protecting the surface of silicon dioxide wafers from scratches and defects occasioned by abrasion during the slurry-less CMP process.

Somasundaran et al. "Surfactant adsorption at the solid-liquid interface Dependence of mechanism of chain length", J. Phys. Chem., Vol.68, pp.3562–3566 (1964), disclose that:
  a) the concentration of surfactant required to neutralize the surface charge on silica decreases with increasing chain length; and
  b) from the critical concentration to neutralize the surface charge (as observed indirectly from a zero zeta-potential measurement for silica particles in an aqueous solution), the van der Waals energy scales is 0.97 kT per $CH_2$ group or 580 cal/mole.

On the basis of the Somasundaran et al., reference it would appear that there is a lateral hydrophobic bonding between the alkyl chains that are adsorbed on the silica surface. U.S. Pat. No. 5,769,689 discloses compositions for a method of polishing a workpiece comprised of silicon dioxide wherein the surface of the workpiece is exposed to a polishing composition comprising water, submicron $SiO_2$ particles, a soluble inorganic salt at a concentration below the critical coagulation concentration for the composition, and wherein the pH of the composition is adjusted to within a range of about 9–10 by the addition of a soluble amine.

Kumar et al., "CHEMICAL-MECHANICAL POLISHING OF COPPER IN GLYCEROL BASED SLURRIES", Mat. Res. Soc. Symp. Proc. Vol. 427, pps. 237–242 (1996), discloses the use of a slurry containing glycerol and $Al_2O_3$ abrasive for CMP processing of a copper metal surface to render the copper suitable as an interconnect fabrication. The process is an alternative to reactive ion etching of copper.

A chemical-mechanical polishing technique for LSI's to address the problem of dishing is disclosed in U.S. Pat. No. 5,607,718, in which a number of compounds are added to decrease the solution velocity and suppress dishing. These compounds include a number of thickeners such as silicates, glucose, tragacanth gum and agar.

Nojo et al., "SLURRY ENGINEERING FOR SELF-STOPPING, DISHING FREE $SiO_2$ -CMP", IEDM, pages 349–352, © 1996 IEEE, disclose a slurry in which a surfactant was added to a conventional $CeO_2$ slurry for $SiO_2$ in chemical mechanical polishing (CMP) to obtain global planarization within a chip without any stopping layer or design limitations.

U.S. Pat. No. 4,588,474 discloses a cleaning treatment on a metal surface wherein glycerin is added to the solution along with other additives to obtain a smoother and more uniform surface. These solutions contain a caustic, a nitrate or nitrite, and optionally, a diol or polyol such as ethylene glycol or glycerin, and the workpiece is an aluminum alloy.

An electrochemical polishing technique for metal removal and planarization of various components in various stages of microelectronic fabrication is disclosed in U.S. Pat. No. 5,567,300. This patent is directed to feature removal, and uses a non-viscous polyol to enhance removal. Glycerin, which has a viscosity at room temperature of 1500 times that of water, is used in electroetching to increase the electrolyte viscosity and promote polishing.

A significant disadvantage of the processes in the foregoing patent and literature references is that, there is no acknowledgment of the need to improve defect control of silicon dioxide chemical mechanical polishing (CMP) in a slurry-less system through chemistry modifications to the aqueous medium.

SUMMARY OF THE INVENTION

One object of the present invention is to provide improved defect control of silicon dioxide during chemical mechanical polishing in a slurry-less system to reduce or eliminate polishing related scratches and defects.

Another object of the present invention is to provide improved defect control of silicon dioxide during chemical mechanical polishing in a slurry-less system by the addition of specific kinds of cationic surfactants that chemisorb onto silica surfaces under neutral and alkaline pH conditions.

A further object of the present invention is to provide improved defect control of silicon dioxide during chemical mechanical polishing in a slurry-less system by addition to the slurry-less system of cationic surfactants selected from the group that would produce the cationic ion from the group consisting of:

Alkyl-trimethyl-ammonium halides; alkyl-benzyl-dimethyl-ammonium halides; pyridinium-alkyl halides; alkyl-ammonium esters; and mixtures thereof. The aniomic group could be varied to obtain the respective cationic surfactant ion.

In general, the invention is accomplished by the addition of cationic surfactants selected from the group of: alkyl-trimethyl ammonium halides; akyl-benzyl-dimethyl-ammonium halides; pyridinium-alkyl halides; alkyl-ammonium esters, and mixtures thereof, in a slurry-less system, prior to chemical mechanical polishing of silicon dioxide wafers at neutral or alkaline pH conditions, in amounts below the critical micelle concentration (the concentration beyond which surfactants tend to self-aggregate) or less than 0.1 mole/L.

DETAILED DESCRIPTION OF THE INVENTION

Figure 1:
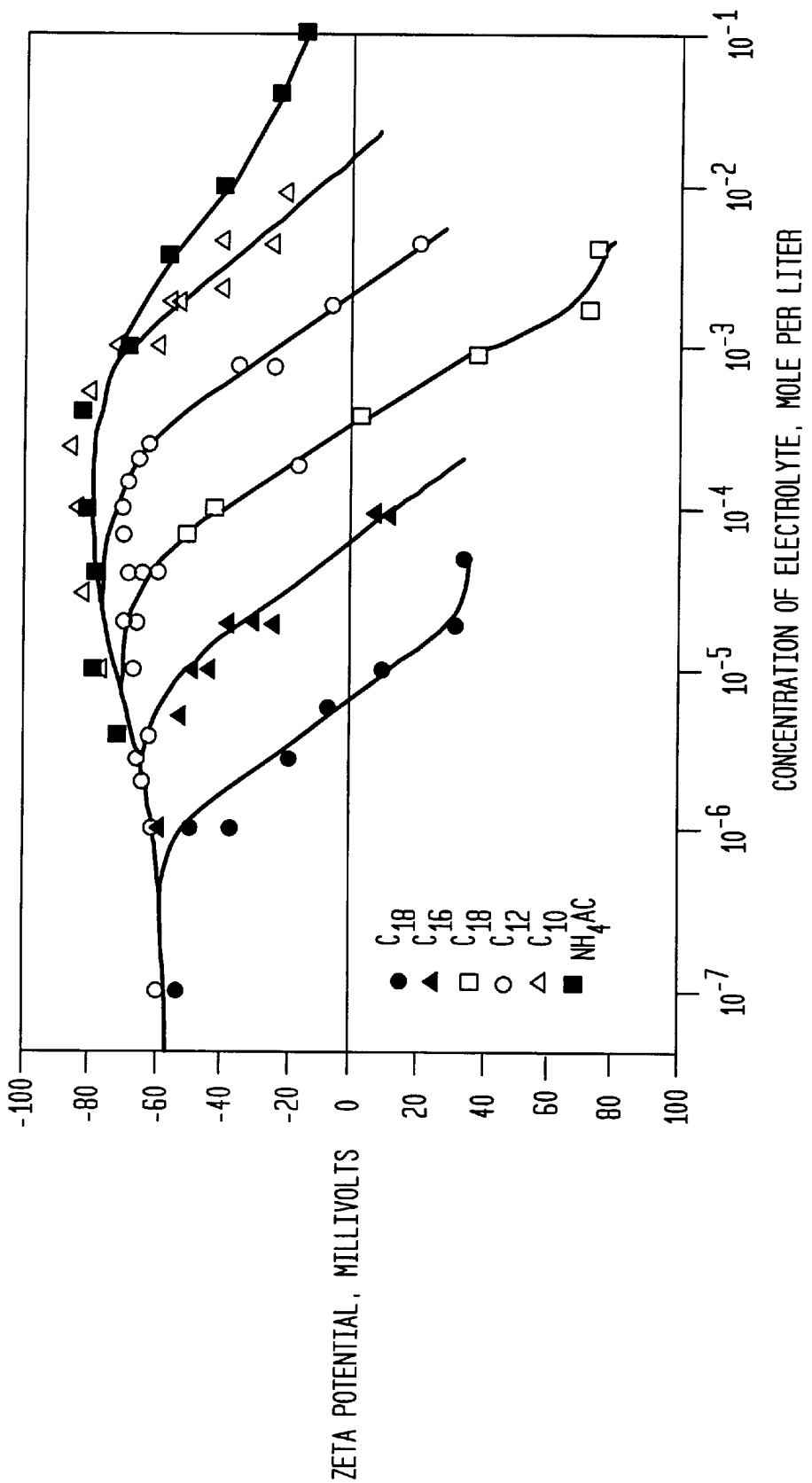
FIG. 1 is a graph showing the effect of hydrocarbon chain length on the zero-potential of quartz in solutions of alkylammonium acetates and in solutions of ammonium acetate.

The foregoing and other objects and advantages of the invention will be better understood by resort to the following detailed description of the preferred embodiments of the invention.

To protect or provide improved defect control of silicon dioxide wafers during chemical mechanical polishing (CMP) in a slurry-less system, the addition of certain kinds of cationic surfactants were added to reduce polishing scratches and defects. These cationic surfactants chemisorb onto the silica surfaces at neutral and alkaline pH conditions, thereby protecting the wafer surface from polish scratches and defects. The wafer to be polished is abraded against the pad surface and typically, the pads contain $CeO_2$ as the abrasive material, which is embedded therein.

In the tooling system employed for chemical mechanical polishing, an aqueous solution that is either neutral or alkaline is used for polishing, and while not wishing to be bound by any theory of how the invention works, it is believed that the addition of cationic surfactants chemisorbs onto the silica surface to affect interaction coupling between the silica surface and the positively charged head group.

The four classes of cationic surfactants useful in the context of the invention are selected from the group consisting of: 1) alkyl-trimethyl-ammonium halides, having an alkyl length of $C_6$–$C_{18}$, amongst which, hexadecyl-trimethyl-ammonium-bromide is preferred; 2) alkyl-benzyl-dimethyl-ammonium halides, having an alkyl length of $C_6$–$C_{18}$, of which hexadecyl-benzyl-dimethyl-ammonium bromide and dodecyl-benzyl-dimethyl-ammonium bromide are preferred; 3) pyridinium-alkyl halides, having an alkyl group of $C_6$–$C_{18}$, of which cetyl-pyridinium-chloride is preferred; and 4) alkyl-ammonium esters, having an alkyl group from $C_6$–$C_{18}$, of which dodecylammonium acetate is preferred; and mixtures thereof.

In the context of the invention, mixtures of the cationic surfactants may be utilized to form a composite solution. Alternatively, mixtures of surfactants, of which one or more of the four classes of cationic surfactants are present in predominate amount may be mixed with small amounts of anionic and/or nonionic surfactants as well.

The phenomenon of cationic surfactants chemisorbing strongly to silica surfaces is established in the literature, and an example of cationic surfactant adsorption is explained with alkyl-amines interaction with $SiO_2$. The adsorption free energy has two main terms: the electrical interaction term, which contains the interaction coupling between the silicon surface and the positively charged head group; and the van der Waals terms, which contains the energy required to remove the hydrophobic groups from the aqueous solution noted in the Somasundaran et al. reference previously referred to. In the Somasundaran et al. reference, the following was found:

A) That the concentration of surfactant required to neutralize the surface charge (as is depicted in the graph of FIG. 1, which shows the effect of hydrocarbon chain length on the zeta-potential of quartz in solutions of alkylammonium acetates and ammonium acetate); and B) That the critical concentration to neutralize the surface charge (as may be observed indirectly from a zero zeta-potential measurement for silica particles in an aqueous solution), estimated by the van der Waals energy scales is 0.97 kT per $CH_2$ group or 580 cal/mole.

This would suggest that there is a lateral hydrophobic bonding between the alkyl chains that are adsorbed on the silica surface. Also, the critical concentration required for zeta-potential reversal decreases with increasing chain length.

In the case of the four above mentioned class of surfactants, the CMC or critical micelle concentrations (the concentration beyond which surfactants tend to self-aggregate) in the concentration range is less than 0.1 moles/liter.

Table I is the critical micelle concentrations for some of the alkyl-trimethyl ammonium halides and alkyl-pyridinium halides.

TABLE I

| Surfactant | Solvent | CMC (moles/liter) |
| --- | --- | --- |
| Dodecyl-trimethyl ammonium bromide | Water at 25° C. | 1.6 E-2 |
| Dodecyl-pyridinium chloride | Water at 25° C. | 1.5 E-2 |
| Tetradecyl-trimethyl ammonium chloride | Water at 30° C. | 3.5 E-3 |
| Tetradecyl-pyridinium bromide | Water at 30° C. | 2.6 E-3 |
| Hexadecyl-trimethyl ammonium chloride | Water at 30° C. | 1.3 E-3 |
| Cetyl-pyridinium chloride | Water at 25° C. | 9.0 E-4 |

It can be seen from Table I that the critical micelle concentration (CMC) shifts to lower concentrations with increasing chain length.

Accordingly, in the context of the invention, use of the four classes of cationic compounds in chemical mechanical polishing tools in a slurry-less polishing scheme requires effective concentrations that is less than 0.1 moles/L.

In particular, the effective concentrations would be different for the varying chain lengths, and therefore, concentrations close to the concentration required to obtain zero zeta-potential values or higher are the most effective, and these are typically between 0.01 to 1 millimoles/liter. Preferably, the concentration of the cationic surfactant is lower than the critical micelle concentration (CMC) for the particular surfactant of choice.

In an alternative embodiment of the invention, small concentrations of common anionic polymer may be used in conjunction with a predominant amount of cationic surfactants in the slurry-less system. Use of the anionic polymers are useful because, the polishing pads in the chemical mechanical polishing tool may have $CeO_2$ particles embedded therein, and it may be necessary to coat these particles as they are stripped off from the pad during the CMP operation. For these situations, a small concentration, less than 2 weight percent, and more preferably from about 0.01 to about 1 wt % of a common anionic polymer like polyacrylic acid or ammonium acrylate may be used in conjunction with the cationic surfactant in the aqueous system.

To further reduce defects/scratches in the $SiO_2$ wafer during CMP in a slurry-less system, a non-ionic polymer such as polyacrylamide or polyvinyl alcohol of molecular weight<10,000 may be added to a composite solution mixture of surfactants at a concentration level lower than 1 weight percent, more preferably in the amount of about 0.01 wt %.

The toxicity data and the LD-50 values for some of the four classes of cationic surfactants as measured on rats are shown in Table II.

TABLE II

| Surfactants | Average LD-50 values (mg/Kg) |
| --- | --- |
| Dodecyl-trimethyl-ammonium chloride | 250–300 |
| Hexadecyl-trimethyl-ammonium chloride | 250–300 |
| Hexadecyl-trimethyl-ammonium bromide | 1000 |
| Decyl-dimethyl-benzyl ammonium chloride | 740 |
| Dodecyl-dimethyl-benzyl ammonium chloride | 910 |
| Hexadecyl-dimethyl-benzyl ammonium chloride | 1000 |
| Octadecyl-dimethyl-benzyl ammonium chloride | 3500 |
| Cetyl-Pyridinium chloride | 200 |

It should be noted that, at concentrations less than 1% there are no health-related issues in connection with human use.

From the foregoing, it is clear that amine based cationic surfactants chemisorb onto silica surfaces close to 1 kT contribution to the adsorption free energy and the change in the zeta-potential to positive values with increasing additions of surfactant.

Accordingly, aqueous solutions containing a mixture of surfactants, primarily cationic, and to a smaller extent anionic and/or non-ionic surfactants, adsorb onto the silica part of the wafer surface, at neutral or alkaline conditions, to form a surfactant-coated protective layer, thereby reducing scratches or polishing defects during a slurry-less CMP operation.

While the mentioned examples focus on silicon dioxide wafers, it should be understood that the invention compositions may be utilized on other doped silicon dioxides, such as borophosphatesilicate glasses as well.

Additional advantages and modifications will readily occur to those skilled in the art. Therefore, various modifications may be made without departing from the spirit or scope of the general inventive concept as defined by the appended claims and their equivalents.

What is claimed is:

1. An aqueous slurry-less composition for chemical-mechanical-polishing of a silicon dioxide workpiece comprising: a cationic surfactant that is soluble and ionized at neutral to alkaline pH conditions, said cationic surfactant being present in an aqueous slurry-less composition in an amount less than its critical micelle concentration.

2. The composition of claim 1 wherein said amount less than said critical micelle concentration is less than 0.1 moles/liter.

3. The composition of claim 2 wherein said cationic surfactant is selected from the group consisting of an alkyl-trimethyl-ammonium halide, an alkyl-benzyl-dimethyl-ammonium halide, a pyridinium-alkyl halide, an alkyl ammonium ester, and mixtures thereof, in which said alkyl is from $C_6$ to $C_{18}$.

4. The composition of claim 3 wherein said cationic surfactant is an alkyl-benzyl-dimethyl-ammonium compound.

5. The composition of claim 3 wherein said alkyl-trimethyl-ammonium halide is hexadecyl-trimethyl-ammonium bromide.

6. The composition of claim 3 wherein said cationic surfactant is an alkyl-benzyl-dimethyl-ammonium halide.

7. The composition of claim 6 wherein said alkyl-benzyl-dimethyl-ammonium halide is selected from the group consisting of hexadecyl-benzyl-dimethyl ammonium bromide and dodecyl-benzyl-dimethyl-ammonium bromide.

8. The composition of claim 2 wherein said cationic surfactant is pyridinium alkyl halide.

9. The composition of claim 8 wherein said pyridinium alkyl halide is cetyl-pyridinium-chloride.

10. The composition of claim 2 wherein said cationic surfactant is an alkyl-ammonium ester.

11. The composition of claim 10 wherein said alkyl-ammonium ester is dodecylammonium acetate.

12. The composition of claim 2 wherein an anionic polymer is additionally present in an amount of about less than 2 weight percent based upon the weight of said cationic surfactant.

13. The composition of claim 12 wherein said anionic polymer is selected from the group consisting of polyacrylic acid and ammonium acrylate.

14. The composition of claim 2 wherein a non-ionic polymer is additionally present in an amount about less than 1 weight percent based upon the weight of said cationic surfactant.

15. The composition of claim 14 wherein said non-ionic polymer is selected from the group consisting of polyacrylamide and polyvinyl alcohol.

16. The composition of claim 2 wherein said cationic surfactant comprises bromide.

17. A method for reducing scratches and defects during chemical mechanical polishing of a silicon dioxide workpiece, comprising: exposing the surface of said workpiece to a slurry-less polishing composition comprising a cationic surfactant that is soluble and ionized at neutral to alkaline pH conditions, said cationic surfactant being present in an aqueous slurry-less composition in an amount less than its critical micelle concentration.

* * * * *